United States Patent [19]

Hutson et al.

[11] Patent Number: 6,091,609
[45] Date of Patent: Jul. 18, 2000

[54] ELECTRONIC CIRCUIT CARD HAVING TRANSIENT-TOLERANT DISTRIBUTION PLANES

[75] Inventors: Maurice Leron Hutson, Byron; Douglas Allan Kuchta; Paul Steven Severson, both of Rochester, all of Minn.

[73] Assignee: International Business Machines Corporation, Armonk, N.Y.

[21] Appl. No.: 09/146,010

[22] Filed: Sep. 2, 1998

(Under 37 CFR 1.47)

Related U.S. Application Data

[63] Continuation-in-part of application No. 09/082,897, May 21, 1998, Pat. No. 6,014,319.

[51] Int. Cl.[7] ............................. H05K 7/06; H05K 1/14
[52] U.S. Cl. .................. 361/794; 361/729; 361/780; 361/788; 307/43; 710/103
[58] Field of Search ...................... 361/777, 780, 361/788, 794, 729; 174/255, 261; 333/12, 33, 34, 246, 247; 257/728; 439/61, 65; 307/43, 80, 150; 710/103

[56] References Cited

U.S. PATENT DOCUMENTS

| | | | |
|---|---|---|---|
| 4,999,787 | 3/1991 | McNally et al. | 710/103 |
| 5,006,961 | 4/1991 | Monico | 361/788 |
| 5,157,771 | 10/1992 | Losi et al. | 710/103 |
| 5,210,855 | 5/1993 | Bartol | 710/102 |
| 5,282,112 | 1/1994 | Bremer | 361/729 |
| 5,308,926 | 5/1994 | Auerbuch et al. | 361/794 |
| 5,317,697 | 5/1994 | Husak et al. | 710/103 |
| 5,365,407 | 11/1994 | Nakabayashi et al. | 361/794 |
| 5,584,058 | 12/1996 | Husak et al. | 713/300 |
| 5,617,081 | 4/1997 | Madnick et al. | 340/825.03 |
| 5,682,298 | 10/1997 | Raynham | 361/794 |
| 5,793,098 | 8/1998 | Uchida | 361/777 |
| 5,815,373 | 9/1998 | Johnsen et al. | 361/794 |
| 5,864,092 | 1/1999 | Gore et al. | 361/794 |
| 5,912,809 | 6/1999 | Steigerwald et al. | 361/780 |
| 5,926,377 | 7/1999 | Nakao et al. | 361/794 |
| 5,942,960 | 8/1999 | Schiltmans et al. | 333/247 |

OTHER PUBLICATIONS

IBM Technical Disclosure Bulletin, vol. 35, No. 5, Oct. 1992, pp. 391–394, entitled "Met Card 'Hot Plug' Detection and Control" by P.W. Oman et al.

*Primary Examiner*—Leo P. Picard
*Assistant Examiner*—John B. Vigushin
*Attorney, Agent, or Firm*—Roy W. Truelson

[57] ABSTRACT

An electronic system contains a backplane circuit card which supplies power to various modules. Embedded power distribution planes each include one or more islands, each island being associated with a respective module. The island is electrically isolated from the body of the power plane except at a relatively small area, called the power ramp. The electronic current path from the power plane to the module goes through the power ramp and the island. Preferably, a pair of adjacent power planes at +48 VDC and 0 VDC are in the middle layers of the backplane with a ground plane on either side. Signal planes carrying circuit patterns for multiple data signals are deposited as additional layers on either side of the ground planes. The pair of power planes are nearly identical patterns, the differences being the location of power connections for the modules. In particular, the islands and power ramps are located in the same places on each power plane. This causes substantially equal but opposite current densities in the power planes, so that transients induced when a module is removed from or inserted into a powered-on system are significantly reduced. The exemplary embodiment is an intelligent redundant array of independent disks (RAID) storage server having concurrent maintenance capability.

17 Claims, 14 Drawing Sheets

ELECTRONIC CIRCUIT CARD HAVING TRANSIENT-TOLERANT DISTRIBUTION PLANES

RELATED APPLICATION

The present application is a continuation-in-part of U.S. patent application Ser. No. 09/082,897, filed May 21, 1998, now U.S. Pat. No. 6,014,319 by Douglas A. Kuchta et al., entitled "Multi-Part Concurrently Maintainable Electronic Circuit Card Assembly", which is herein incorporated by reference.

FIELD OF THE INVENTION

The present invention relates to electronic circuit cards, and in particular to "backplane" cards of a type used to distribute power, logic signals or other signals to other attached modules.

BACKGROUND OF THE INVENTION

The spectacular proliferation of electronic devices, particularly computers, in modem society, both in numbers and complexity, demands that such devices satisfy ever increasing standards of reliability and serviceability to avoid degeneration into chaos. In the early days of the computer industry, relatively high failure rates and corresponding "down time" when the computer system was unavailable to perform useful work were accepted as the norm. As the industry has matured, computers have become more reliable, and users have come to depend on these systems being available when needed. This dependence has become so profound that, for many businesses, the mere unavailability of the computer system for any appreciable length of time can cause significant commercial injury.

Electronic devices generally, and computers in particular, tend to be vulnerable to "transients", i.e., sudden large voltage and/or current impulses of typically short duration. These can cause data loss by corrupting any of numerous signals being transmitted among various components of a computer system, or can cause changes of state in memory cells, or can even cause hardware damage. Transients occur due to a variety of environmental sources. Some of these transients can be reduced with proper system design techniques, although it is impossible to eliminate all transients. Likewise, electronic systems can be made less susceptible to transient induced failures with proper design techniques, but it is impossible to eliminate all vulnerability to such failures. Of particular interest herein, transients and failures may occur as a result of attempts to concurrently use and maintain a system.

In the early days of the computer industry, a computer component was replaced by shutting off power to the system, replacing the component, and re-powering the system. This is, of course, a logical way to fix a toaster, but the complexity of a modern computer, and its importance to its users, makes this undesirable. It is not possible to simply shut off power and turn it back on as one would a light bulb. A computer system's state and data must be saved when it is powered down. Its software must be re-loaded, and its state restored, when it is re-powered. For a large modem computer system, these operations can take a very significant amount of time, during which the system is unavailable to its users.

Computer manufacturers are well aware of the dependence of their customers, and have accordingly devoted considerable attention to these problems. As a result, many modern computer system have some degree of fault tolerance, and are capable of concurrent maintenance. Fault tolerance means simply that a single component of the computer system may fail without bringing the entire system down, although in some cases performance of the system or some other characteristic may be adversely affected. Concurrent maintenance is the capability to repair or replace some component of a computer system without shutting down the entire system, i.e., the system can continue to operate and perform useful work (although possibly in a diminished capacity) while the repair is being performed. A system which is both fault tolerant and capable of concurrent maintenance can, in theory, be kept running 24 hours a day for an indefinite length of time. In fact few, if any, systems achieve this level of reliability with respect to every component which may possibly fail.

One example of this type of fault tolerance is an array of storage devices known as a "RAID", i.e. redundant array of independent disks. A RAID stores data on multiple storage devices in a redundant fashion, such that any data can be recovered in the event of failure of any single storage device in the array. RAIDs are usually constructed with rotating magnetic hard disk drive storage devices, but may be constructed with other storage devices such as optical drives, tape drives, etc. Various types of RAIDs providing different levels of redundancy or other operating characteristics are described in a paper entitled, "A Case for Redundant Arrays of Inexpensive Disks (RAID)", by Patterson, Gibson & Katz, presented at the ACM SIGMOD conference (June, 1988). Patterson, et al., classify five types of RAID, designated levels 1 through 5. The Patterson nomenclature has become standard in the industry. RAIDs have proliferated to the point where an industry trade group called the RAID Advisory Board has attempted to establish standards for RAID characteristics. Further information regarding RAIDs can be found in *The RAIDbook, A Source Book for Disk Array Technology,* published by the RAID Advisory Board (5th Ed. February 1996).

Frequently, a RAID is manufactured and marketed as a stand-alone storage subsystem, which is housed in its own cabinet with its own power supply and supporting hardware and software, and which communicates through a standard communications interface with a host computer system. Since it is desirable to make data available to the host system at all times, even if a single storage device in the RAID subsystem fails, the subsystem will frequently have its own on-board data recovery capability, which may include temporary spare drives for storage of recovered data. The RAID subsystem may additionally have redundant power supplies or other redundant components.

Whatever the level of redundancy in a RAID, other subsystem or computer system, it may sometimes be necessary to replace a component. In this case, it is frequently desirable to keep the system or subsystem operating while the component replacement is being performed. Some modern systems have a "hot plugging" capability, whereby a replaced component plugs into a functioning system and immediately receives power from the system, thereby becoming powered-on and potentially operational the instant it is plugged in.

Hot plugging is not a simple matter. If an arbitrary component is replaced by means of hot plugging in an operating computer system, the act of removing the old and inserting the new component can cause serious problems. Arcing, current spikes, and induced transients may potentially cause loss of data or even physical damage to system components. Logic signals may be in undefined states, and with the need to stop or restart the component's normal functions, removal of one component or installation of a replacement component may cause additional problems for system components physically or logically adjacent to the removed or inserted component. Therefore, systems which support hot plugging must be specially designed to handle these problems.

Components may be hot plugged into a backplane power and signal distribution card. Such a backplane contains attachment couplings for one or more other components, which may be cards, or other modules such as disk drives, power supplies, etc. One of the functions of the backplane card (in fact, often the only function) is the distribution of power, data or other signals among the various modules attached to it.

If a powered-on component is suddenly removed from or inserted into a backplane card, the power lines on the backplane will experience a sudden change in current distribution and/or load. The change in power current can not only affect the power lines, but adjacent data lines may experience noise due to electromagnetic effects. Such phenomena can be transmitted to other components attached to the same backplane through power or other lines, potentially damaging the components or causing data loss.

Several options are available in the prior art to support hot plugging components into a backplane card of a computer system or subsystem. It is possible, for example, to design the system so that selective components and bus connections can be logically isolated and gradually powered off while the system continues to operate. This requires special switching circuitry which adds to the cost of the system, and typically requires correct operator intervention (i.e., the correct unit(s) must be powered off). It is further possible to design the system with special circuits and logic which detect the impending removal of a component, and take similar action automatically. But this again adds to the cost of the system. Additionally, components which plug into the backplane might be designed to tolerate larger voltage spikes, but this places additional constraints on the design of components and generally adds to the cost. It is alternatively possible to reduce induced noise by distributing power on dedicated power cables separate from a backplane carrying data or other signals, but this may increase cost, require additional space, or interfere with other design considerations.

While concurrent maintenance is a major consideration, electronic systems comprising pluggable modules in a backplane circuit card may be subject to transients from other sources, as for example, the catastrophic failure of one of the modules. It is desirable to reduce the vulnerability of pluggable component systems to such transients without the attendant cost associated with prior art techniques.

SUMMARY OF THE INVENTION

It is therefore an object of the present invention to provide an enhanced electronic system.

Another object of this invention is to provide an electronic system having increased tolerance to transients.

Another object of this invention is to provide an enhanced backplane circuit card for use in electronic systems.

Another object of this invention is to provide an electronic circuit card for use as a distribution medium having increased tolerance to transients.

Another object of this invention is to increase the concurrent maintenance capability of an electronic system.

Another object of this invention is to reduce the cost of electronic systems having concurrent maintenance capabilities.

Another object of this invention is to reduce the adverse effects of insertion and removal of components from a backplane circuit card to which power is applied.

In accordance with the present invention, an electronic system, such as a digital computer system or a subsystem thereof, contains a backplane circuit card to which is coupled one or more modules. Among other things, the backplane circuit card includes a plurality of power planes for distributing power among the modules. Each power plane includes one or more islands, each island being associated with a respective module. The island is electrically isolated from the body of the power plane except at a relatively small area, called the power ramp. The power current path between the power plane and the module is through the power ramp and the island.

In the preferred embodiment, a pair of DC power planes, such as +48 volts and 0 volts, are placed in the middle layers of the backplane, with a thin dielectric layer separating the two. The pair of power planes are nearly identical patterns, the differences being the location of fills and holes for selectively connecting the power planes to coupling pins for the modules, or to ground planes. In particular, the islands and power ramps are located in the same places on each respective power plane. The same patterns of the two power planes and their close proximity provide substantial electromagnetic coupling of the two planes, reducing transient effects. The pair of power planes is separated from respective logic ground planes on either side by respective relatively thick dielectric layers. Signal planes carrying circuit patterns for multiple data signals are deposited as additional layers on either side of the logic ground planes.

In the preferred embodiment, the electronic system is an intelligent redundant array of independent disks (RAID) storage server, for providing data to multiple host digital data processing systems. The storage server includes a plurality of disk drives and power supplies housed within an enclosure, together with supporting electronic logic cards and other hardware. The various components provide redundant operation in the event of a single failure. Certain logic cards, power supplies and other modules plug into the backplane circuit card, which functions as a distribution medium for power and data signals. The design of the server system, including the design of backplane circuit card and couplings, supports concurrent maintenance, whereby any failing component can be unplugged from the backplane circuit card, removed from the enclosure, and replaced, all without powering down the subsystem. Additionally, it is preferred that the backplane itself be split into multiple circuit cards having duplicative function, so that concurrent maintenance can be performed on the backplane itself.

Because all power connections to a particular pluggable module go through the islands, unsymmetrical current distributions are confined to smaller areas of the power planes, and transients induced when a module is removed from or inserted into a powered-on system are significantly reduced. Thus, the electronic system has an increased tolerance to transients, and in particular can be concurrently maintained with reduced possibility of data corruption or system damage.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
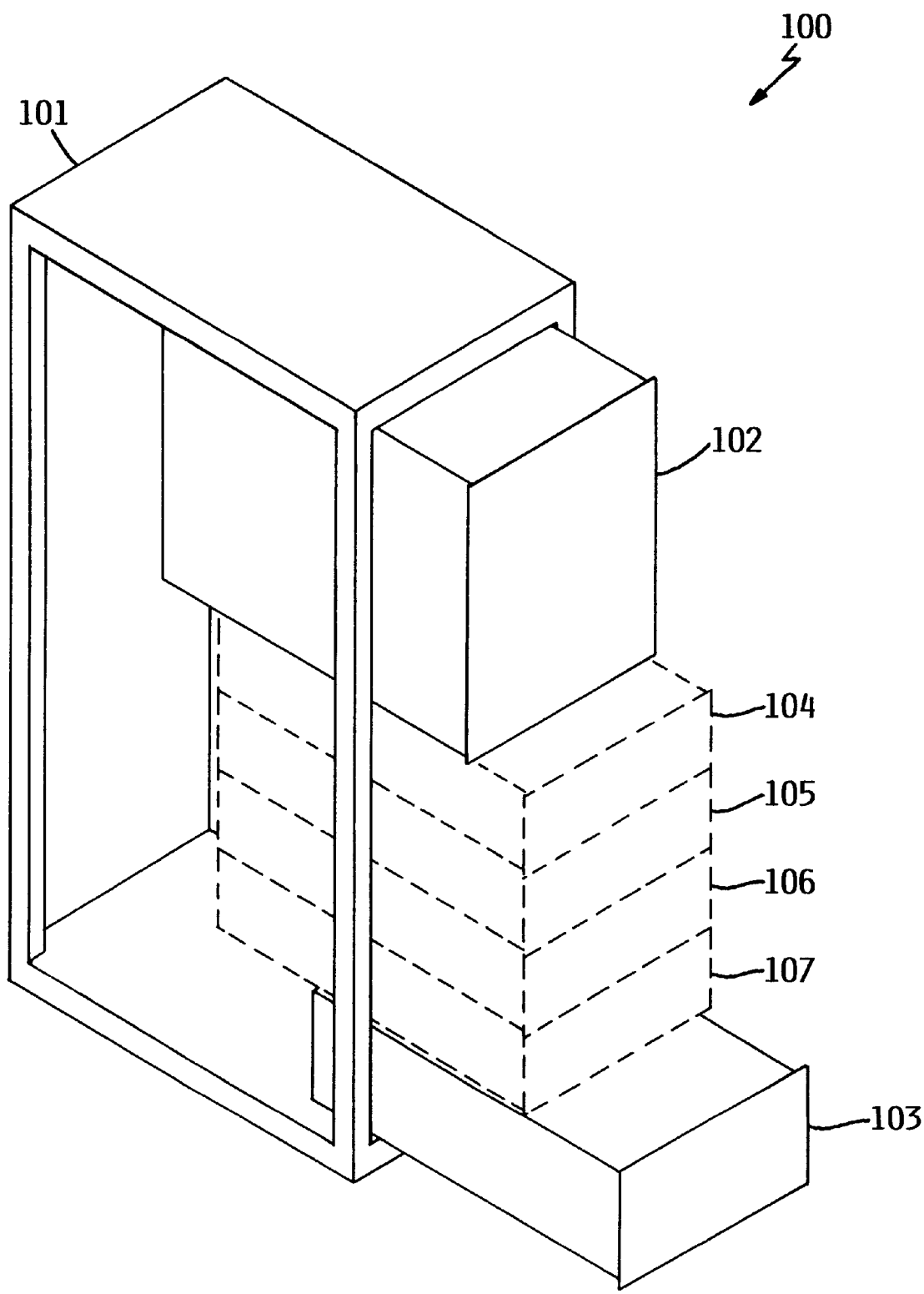
FIG. 1 shows the major components of a RAID subsystem using a backplane circuit card in accordance with the preferred embodiment of the present invention.

FIG. 1 is a high level representation of the major components of server system 100 employing the backplane circuit cards of the present invention, in accordance with the preferred embodiment. In this embodiment, server system is an intelligent and redundant mass repository of data, which it provides on demand to multiple host computer systems which are connected to server system 100. System 100 comprises a frame 101 for housing various electronic modules. These modules are shown in FIG. 1 in slide-out position for illustrative purposes, it being understood that during normal operation the modules are fully inserted in frame 101.

Near the top of the interior of frame 101 is electronics drawer assembly 102. Electronics drawer 102 provides the basic logic and memory functions for operation of system 100. The components and function of electronics drawer 102 are explained in greater detail below with respect to FIG. 2.

At the bottom of frame 101 is power drawer 103, which converts power from an external source to a voltage which is distributed to the various drawers. Specifically, power drawer 103 contains a pair of redundant power supplies, each power supply converting standard AC line voltage to 350 VDC for internal distribution within frame 101. Separate power distribution cables run from each power supply in power drawer 103 to electronics drawer 102 and each storage drawer 104–107, so that 350 VDC power is provided to each drawer in a redundant fashion, enabling system 100 to continue operation even if one of the 350 VDC power supplies fails.

Beneath electronics drawer 102 are several storage drawers 104–107, each of which may contain multiple rotating magnetic disk storage devices for storing data. The multiple rotating magnetic disk storage devices store data in a redundant fashion, according to one or more RAID levels. Additionally, electronics drawer 102 contains hardware and software necessary to reconstruct data stored in any non-functioning disk storage device, and to store this data on a spare or replacement storage device. Thus, data stored on system 100 is available, even though the storage device on which the data was stored is itself incapable of providing the data.

Figure 2A:
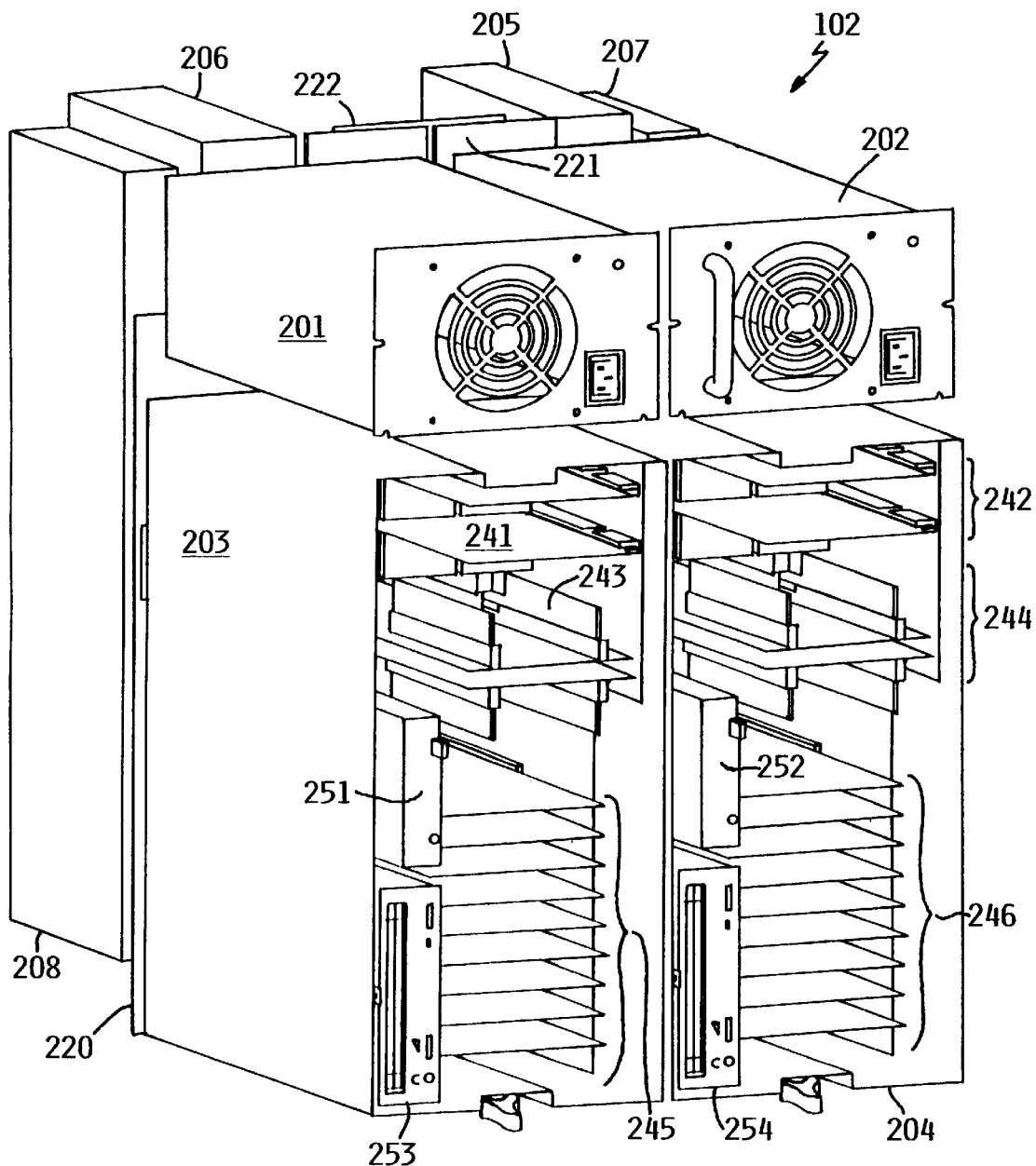
FIGS. 2A and 2B are isometric perspective views of the electronics drawer according to the preferred embodiment.
Figure 2B:
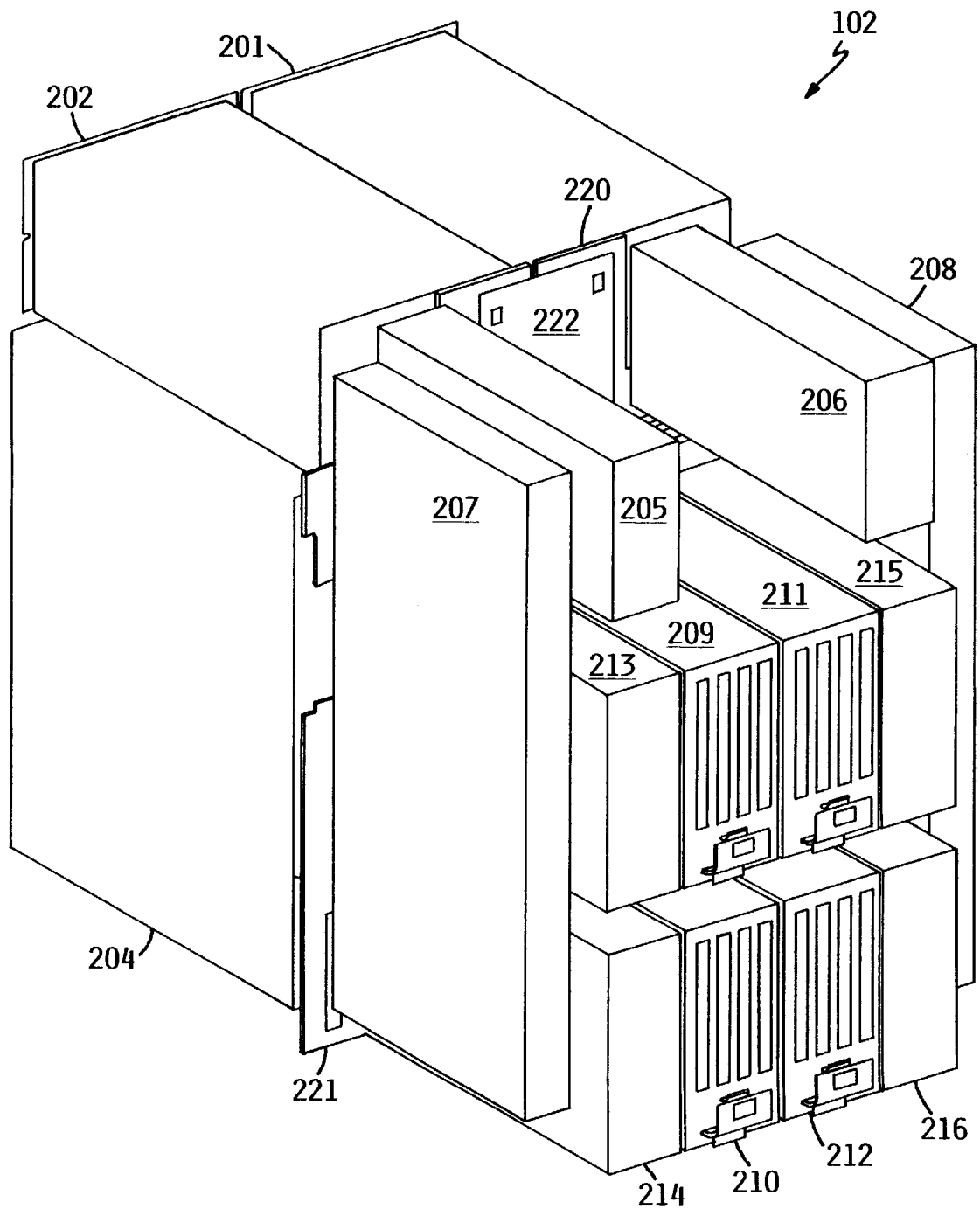

FIGS. 2A and 2B show in greater detail the major interior functional components of electronics drawer assembly 102. FIG. 2A is an isometric perspective front view of electronics drawer 102, while FIG. 2B is an isometric perspective rear view of drawer 102. In general, drawer 102 is housed in a frame (not shown) and includes left and right halves, the functional components of drawer 102 being duplicated in each half. Drawer 102 includes left power supply 201 and right power supply 202. These are essentially identical units, each of which receives 350 VDC power from power drawer 103, and converts it to 48 VDC power for distribution within electronics drawer 102.

Drawer 102 further includes left card cage 203 and right card cage 204. Card cages 203, 204 are essentially duplicates of each other, and house electronic circuit cards and other modules which perform the basic logical functions of system 100. Specifically, left cage 203 includes processor cards 241 which form the central processing unit (CPU), memory cards 243 which store programs and other data for processing by the CPU, I/O cards 245 which provide an interface between I/O devices and modules and a system bus, diskette drive 251 and CD/ROM drive 253. Cage 203 further includes a rotating magnetic hard disk drive, which is not visible. Right cage 204 similarly includes processor cards 242, memory cards 244, I/O cards 246, diskette drive 252, CD ROM drive 254, and hard disk drive (not shown).

The rear side of drawer, visible in FIG. 2B, includes right and left I/O communication modules 209–212. I/O modules 209–212 communicate with one or more host computer systems over a local area network or other medium and/or communicate with storage devices located in drawers 104–107, handling the transfer of data between drawer 102 and the storage devices. I/O modules 209–212 may optionally communicate with additional storage devices located in drawers in adjacent racks (not shown). Data communication cables (not shown) exit the rear of modules 209–212 to connect the modules with their respective hosts, storage devices, or other devices.

Drawer 102 further includes reserved spaces for later system enhancements, depicted in FIGS. 2A and 2B as modules 205–208 and 213–216. Modules 213–216 are intended as additional I/O communications modules, similar in function to modules 209–212. Modules 205 and 206 are intended as optional performance enhancement modules, which may include cache and other logic to increase the performance of the storage subsystem. Modules 207 and 208 are intended as additional non-volatile random access memory (NV RAM), which temporarily store data bound for storage devices located in storage drawers 104–107. Modules 205–208 and 213–216 are shown in FIGS. 2A and 2B although in fact they are not supported by the backplane card design of the preferred embodiment. Support for these modules may require modifications to backplane sections 220 and 221 so that the backplanes would mount connectors supplying power and data signals to the modules.

Modules are electrically connected to one another for distribution of power and data signals by means of a three-part system backplane, comprising left backplane circuit card section 220, right backplane circuit card section 221, and backplane jumper card section 222. As used herein, the term "module" includes any electronic subassembly, such as circuit cards and card cages, as well as fully enclosed modules. Left section 220 and right section 221 are similar, and provide essentially duplicative function. I.e. left section 220 couples the various modules located on the left side of drawer 102, providing power to the modules and permitting data to flow between modules. Right section accomplishes the analogous task for the modules on the right side of drawer 102. Jumper section 222 is smaller than either section 220 or 221. Jumper 222 electrically connects the other two sections, allowing signals to pass between them and distributing power, and provides grounding connections, as explained further herein. Dividing the backplane into two separate sections linked by a jumper, each having duplicative function, makes it possible to replace one of the backplane sections while the other continues to function. While it would have been possible (and generally cheaper) to provide a single larger backplane circuit card, the three part design enhances the concurrent maintenance capability of the system.

Figure 3A:
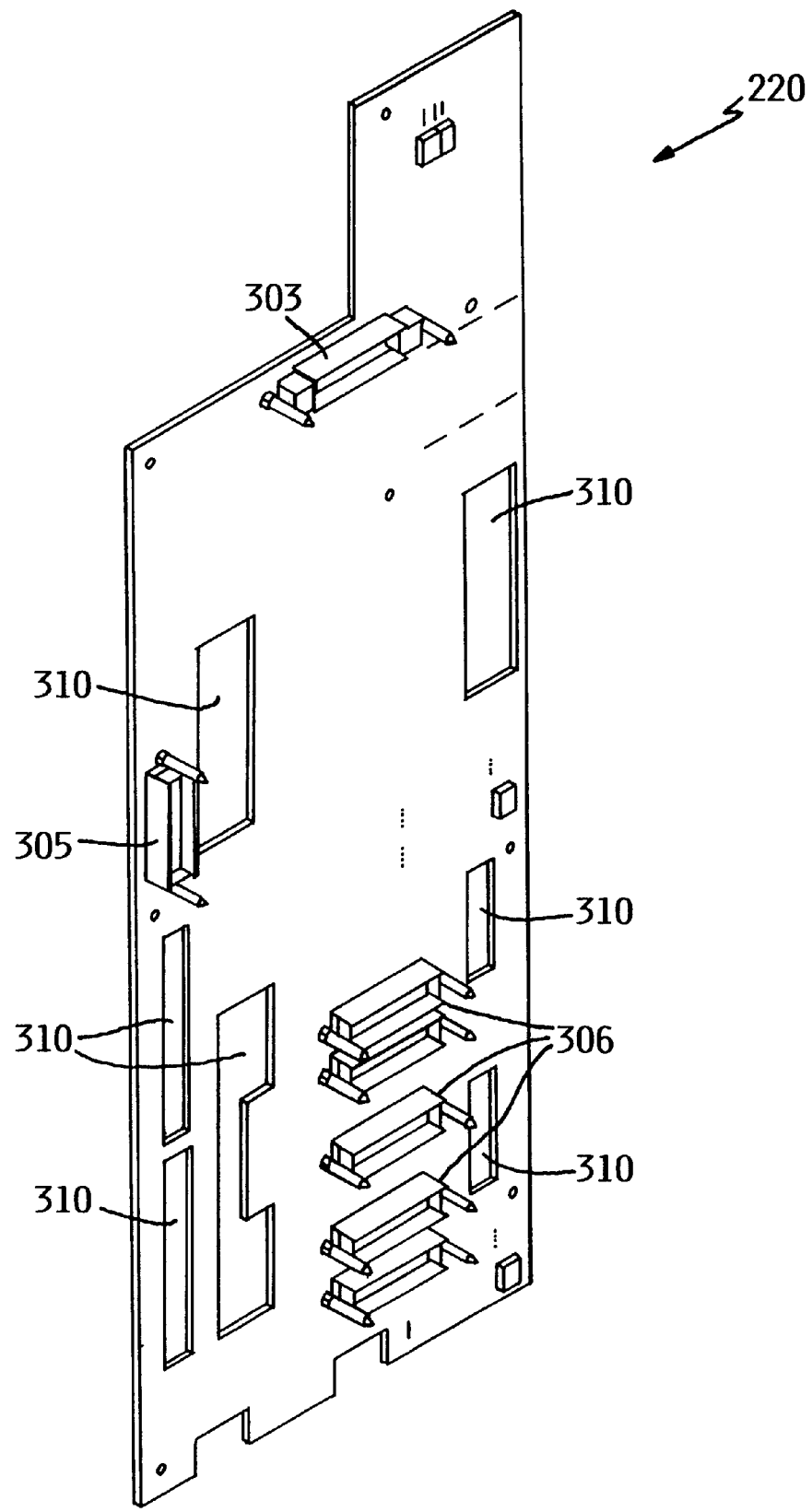
FIGS. 3A and 3B are isometric perspective views of the left section backplane circuit card according to the preferred embodiment.
Figure 3B:
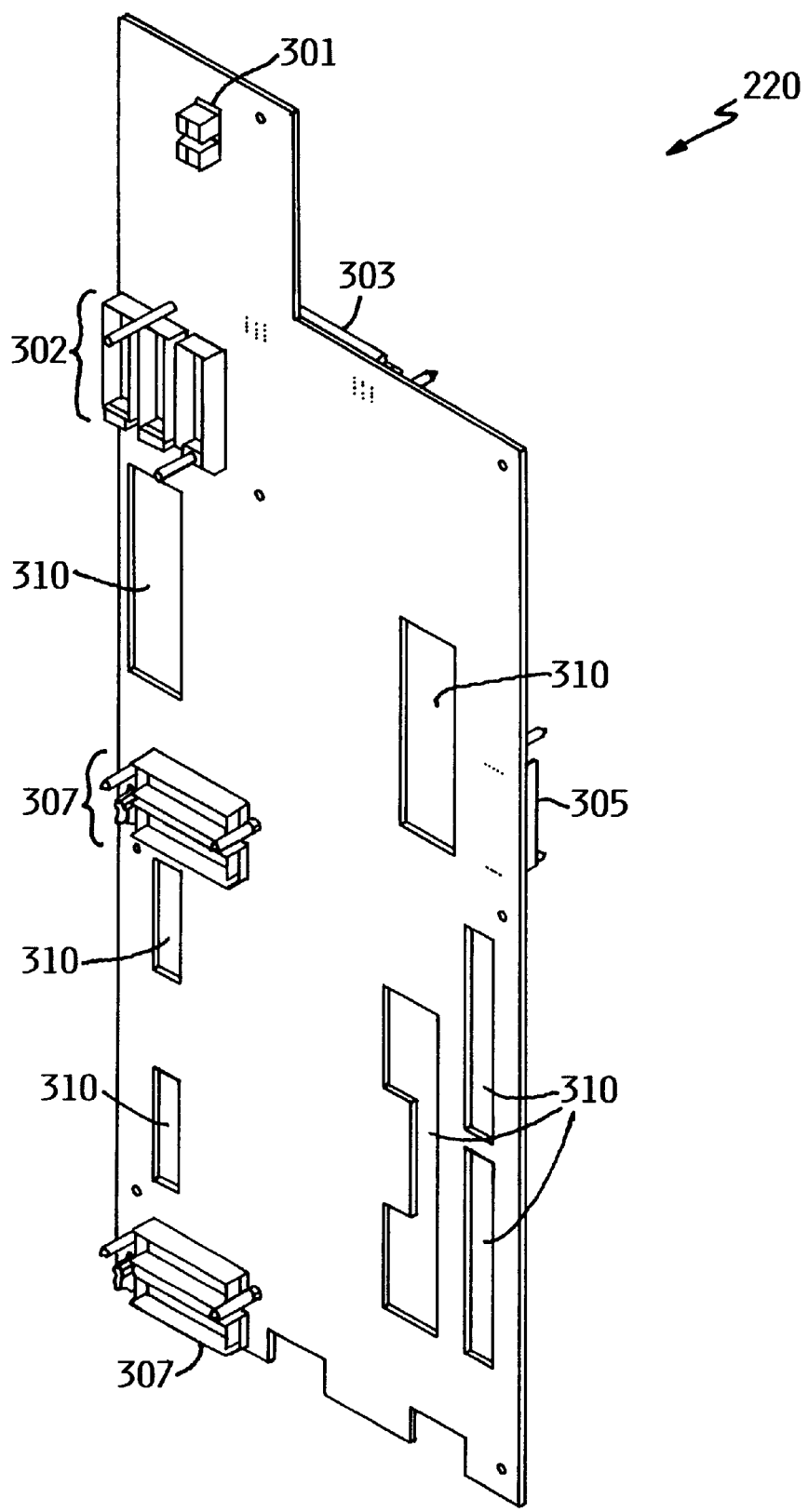

FIGS. 3A and 3B are perspective views of left section backplane circuit card 220 according to the preferred embodiment. FIG. 3A shows the front side of card 220, while FIG. 3B shows the back side. On the back side and near the top of card 220 can be seen a pair of power connectors 301. Beneath power connectors 301 is a set of three signal connectors 302. Power connectors 301 and signal connectors 302 mate with corresponding connectors 501 and 502 respectively on jumper card 222 to form the connection with the jumper card. Additional connectors mate with corresponding connectors on the various modules. Specifically, power supply connectors 303 mate with left power supply 201; card cage connectors 305 mate with connectors of a power supply (not visible) in left card cage 203 which provides power at working voltages and status information for main processor cards 241, memory cards 243, various I/O cards 245, etc.; I/O card connectors 306 mate with connectors in card cage 203 for the various I/O cards 245; and I/O module connectors 307 mate with the left I/O adapter modules 211 and 212. Embedded signal lines are formed in a plurality of conductive planes in circuit card 220, running between the various connectors. Holes 310 in card 220 allow cooling air to pass through the backplane.

Figure 4A:
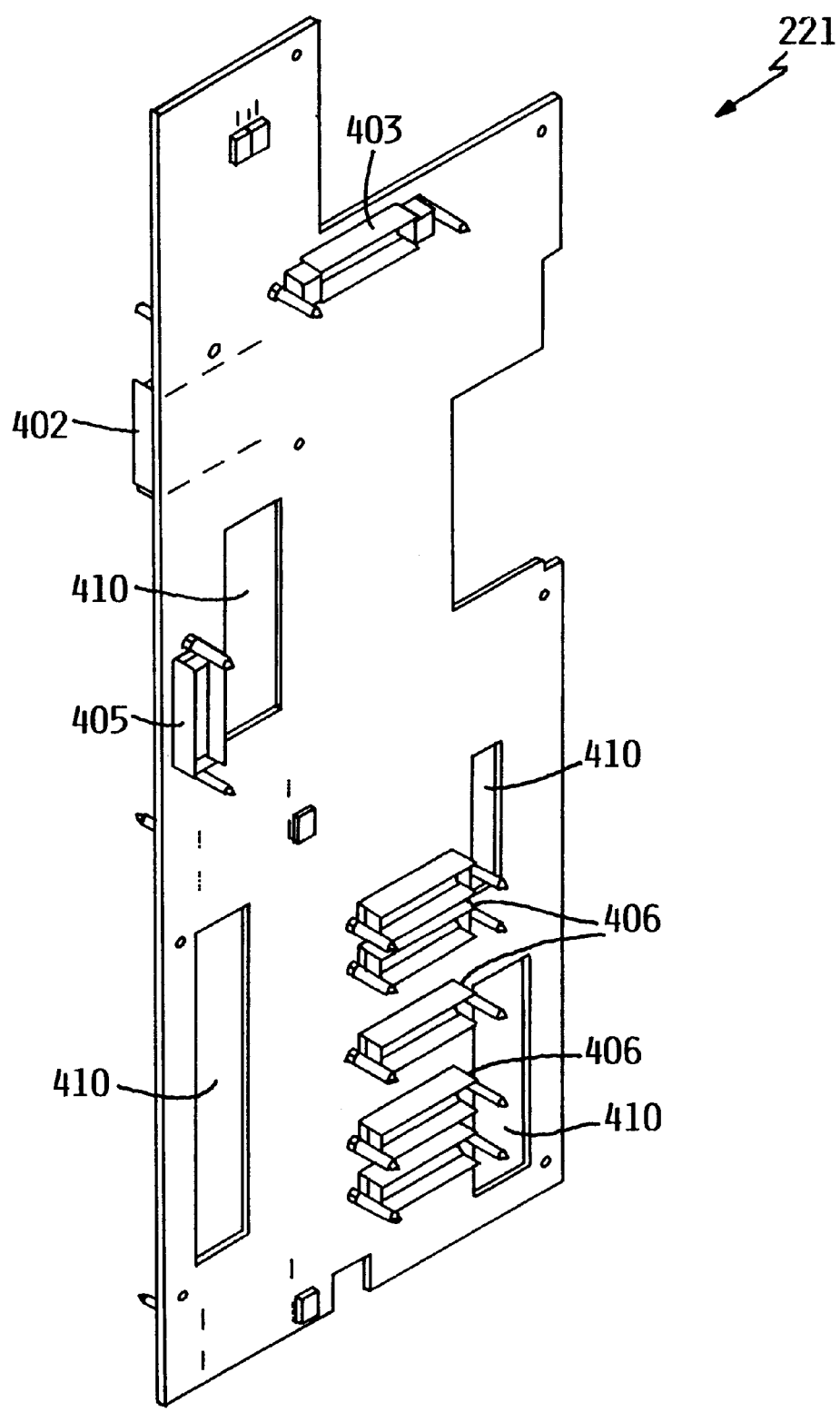
FIGS. 4A and 4B are isometric perspective views of the right section backplane circuit card according to the preferred embodiment.
Figure 4B:
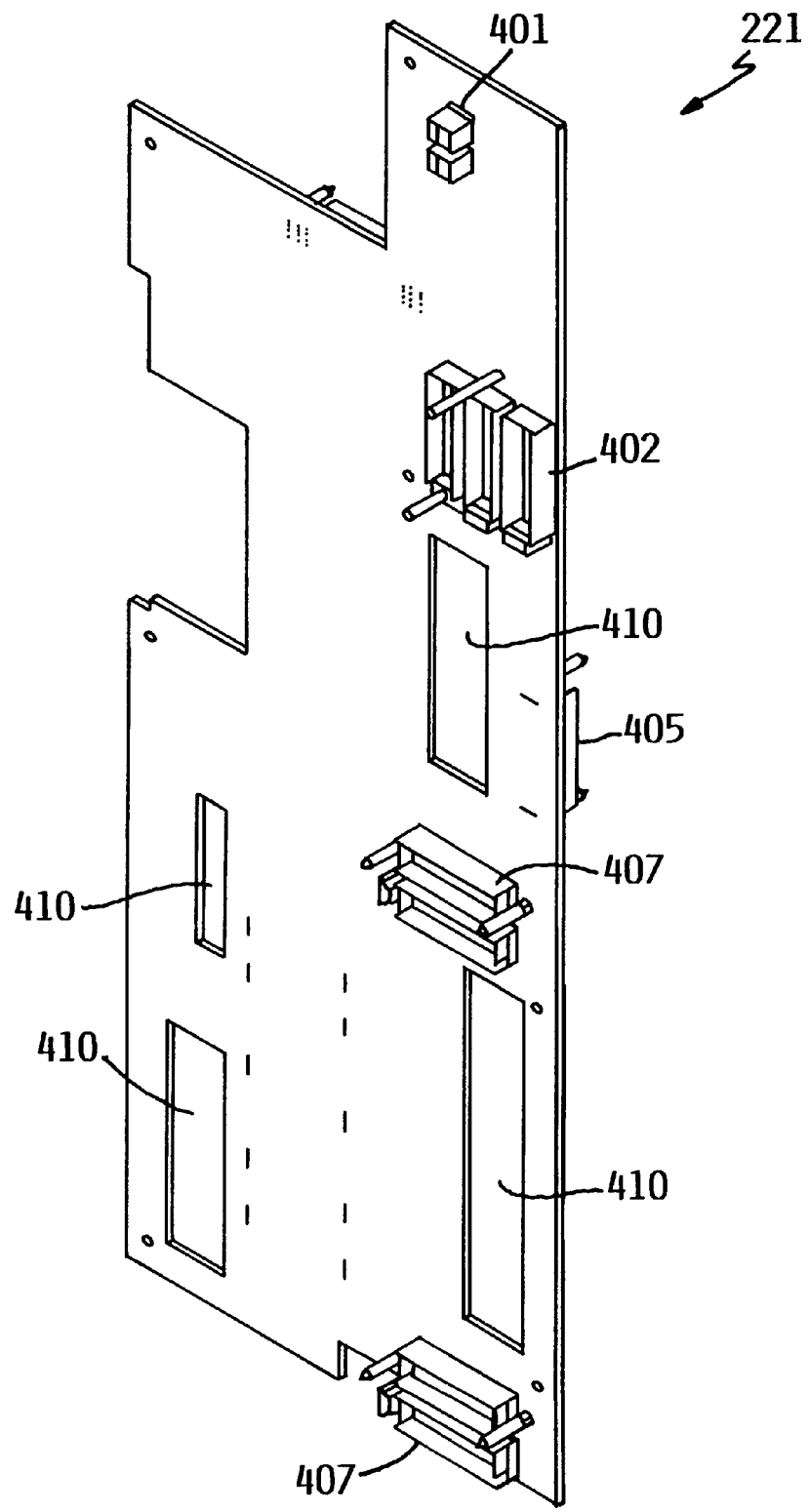

FIGS. 4A and 4B are perspective views of the right section of backplane circuit card 221, according to the preferred embodiment. Circuit card 221 is generally similar in construction and function to card 220. FIG. 4A shows the front side of card 221, while FIG. 4B shows the back side. Power connectors 401 and signal connectors 402 form connections to connectors 503 and 504 respectively of jumper card 222, similarly to left section card 220. Power supply connectors 403 mate with right power supply 202; card cage connectors 405 mate with connectors of a power supply (not visible) in right card cage 204 which provides power at working voltages and status information for main processor cards 242, memory cards 244, various I/O cards 246, etc.; I/O card connectors 406 mate with connectors in card cage 204 for the various I/O cards 246; and I/O module connectors 407 mate with right I/O adapter modules 209 and 210. Embedded signal lines are formed in a plurality of conductive planes in circuit card 221, running between the various connectors. Holes 410 permit the passage of cooling air.

Figure 5A:
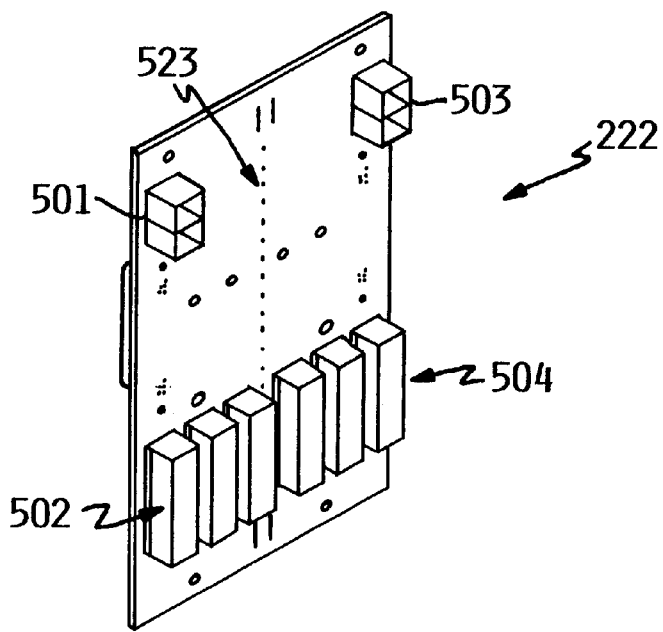
FIGS. 5A and 5B are isometric perspective views of the jumper section circuit card, according to the preferred embodiment.
Figure 5B:
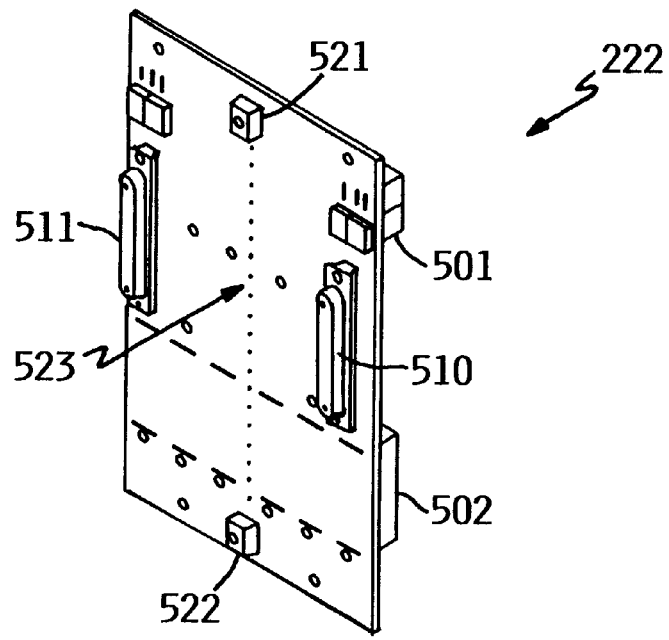

FIGS. 5A and 5B are perspective views of jumper section circuit card 222, according to the preferred embodiment. Jumper section is located in the top center of electronics drawer 102, straddling the two circuit cards 220, 221. Power connectors 501 and 503 are electrically connected to each other via embedded power planes to transmit power between the connections to left section 220 and right section 221 respectively. Various pins in signal connectors 502 and 504 are likewise electrically connected to each other via a plurality of discrete embedded signal lines in jumper card 222, providing a communications path for data and other signals between the left and right circuit cards. Ground plugs 521 and 522 provide redundant locations for the attachment of a ground bus to the frame of drawer 102, which is in turn grounded to frame 101.

Power monitor connectors 510 and 511 receive the mating connectors of corresponding redundant cables (not shown) which run between jumper 222 and redundant 350 VDC power supplies in power drawer 103. These connectors and cables do not carry power, but carry data signals used for monitoring and regulating power. Specifically, power is continually regulated so that, under normal operating conditions, power supply 201 provides all power to modules attached to circuit card 220, while power supply 202 provides all power to modules attached to circuit card 221. The power provided by these power supplies is thus balanced, so that no power current is flowing through the jumper from one half of the backplane to another. However, where one power supply fails, its redundant neighbor will supply power to the other half of the backplane through the jumper.

Each of cards 220, 221 and 222 comprise multiple alternative electrically conductive and non-conductive layers. These layers are constructed using any of various conventional methods known in the art. Non-conductive layers are constructed of a suitable fiberglass epoxy material. Conductive layers are constructed of copper foil, which is etched, drilled, or otherwise formed to an appropriate pattern. Conductive layers can be broadly divided into two categories: (a) signal layers, and (b) power and ground layers. Signal layers typically contain conductive patterns in the form of many relatively narrow electrically isolated signal lines, each line running between two or more locations (such as pins or vias) in the plane. Power and ground layers typically contain only a single electrical pattern for supplying voltage and/or providing impedance matching. A power or ground layer is typically a broad sheet of substantially uniform thickness and conductivity occupying nearly all of the surface area of the plane, with only small areas around pins or vias removed to insulate the pin or via from the voltage of the power/ground layer.

Figure 6:
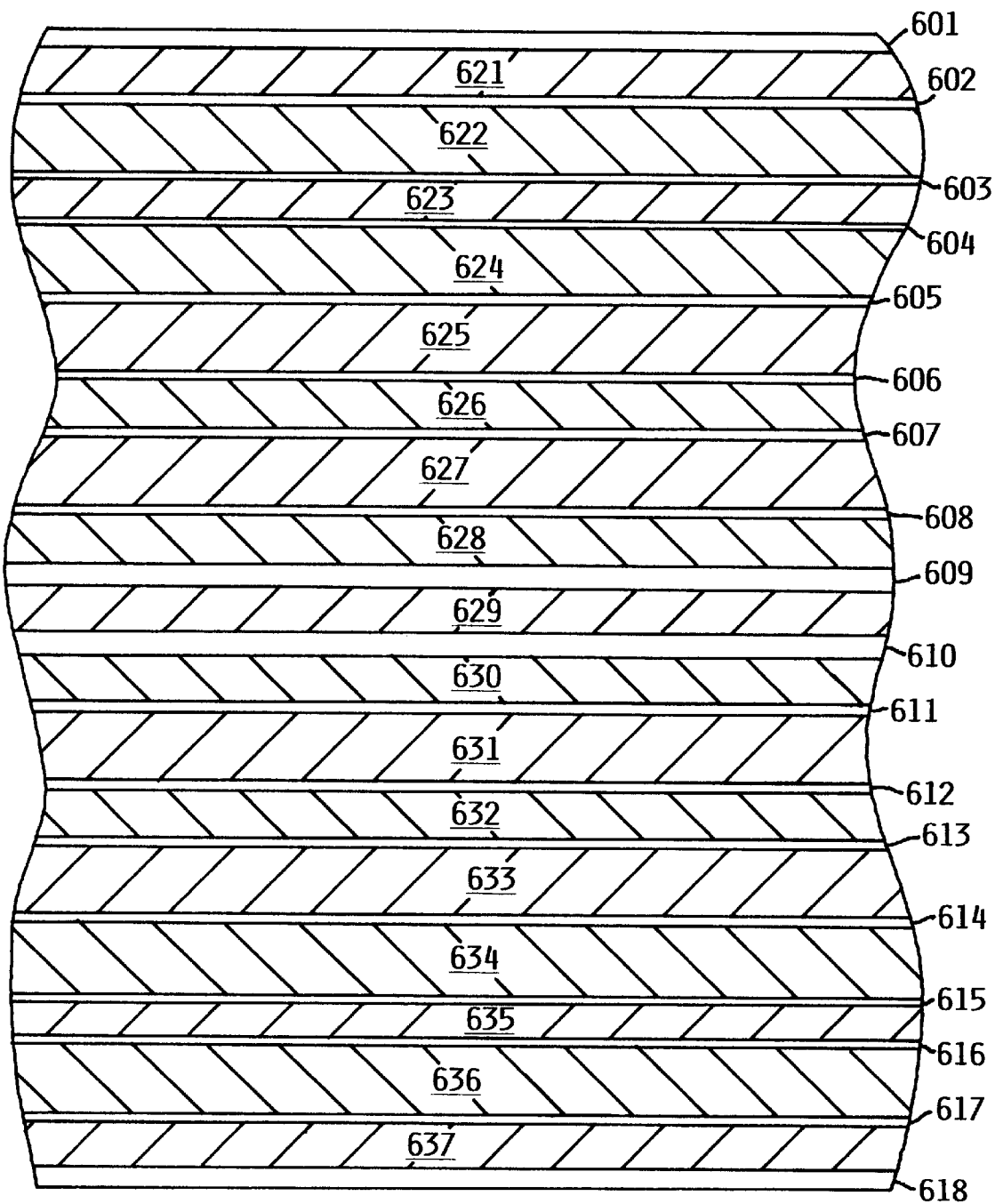
FIG. 6 is a cross-sectional view of a representative portion of one of the backplane circuit cards, showing the various conductive and non-conductive layers, according to the preferred embodiment.

FIG. 6 is a cross-sectional view of a representative small portion of one of backplane circuit cards 220, 221 or 222, according to the preferred embodiment. Conductive layers 601–618 alternate with non-conductive (dielectric) layers 621–637. Layers 603, 604, 606, 607, 612, 613, 615, and 616 are internal signal layers, i.e., signal layer planes which are buried in the middle of the circuit card. Layers 601 and 618 are signal layers lying on either surface of the card. Ground layer planes 602, 605, 608, 611, 614 and 617 provide impedance control for adjacent signal layers.

In the middle of the card lie two power layer planes 609, 610. Power plane 609 carries +48 VDC power supply voltage, while power plane 610 is 0 VDC power return voltage. While the grounds are also nominally 0 V, plane 610 is different from the ground planes because plane 610 carries substantial DC electrical current required for providing power to the various modules. Accordingly, both power planes 609 and 610 are substantially thicker than the signal planes or the ground planes. Specifically, in the preferred embodiment, internal signal planes and ground planes have a nominal design thickness of 0.03 mm, while power planes 609 and 610 have a nominal design thickness of 0.064 mm. Surface signal planes 601 and 618 are thicker than internal signal planes, having a nominal design thickness of 0.058 mm for ruggedness.

Each plane is depicted in FIG. 6 as a continuous, uniform thin sheet for purposes of illustrating the relative locations and thicknesses of the layers only. It will be understood that in fact discontinuities exist in various places, and particularly that signal layers comprise multiple discrete lines which are not shown in FIG. 6. Furthermore, it will be understood that various vias exist in cards 220–222 for connecting one plane with another. Signal vias generally connect a signal line in one plane with a signal line in another plane. Generally, for each signal via there is also an adjacent ground via which connects the ground plane adjacent the plane of one signal line with the ground plane adjacent the plane of another signal line, for impedance matching purposes. (In the preferred embodiment, each such ground via connects all ground planes together.)

Except in jumper 222, ground vias are insulated from the 0 VDC power plane. I.e., on cards 220 and 221, ground planes 602, 605, 608, 611, 614 and 617 are not electrically connected to 0 VDC power plane 610. The tying of 0 VDC power to ground is accomplished in jumper 222. Specifically, ground plugs 521 and 522 include pins extending through the full thickness of jumper 222, which are electrically connected to each ground plane and to 0 VDC. Additionally, a row of ground vias 523 runs down the center of card 222 between plugs 521 and 522, each via electrically connecting all ground planes and the 0 VDC power plane. All ground planes within the left 220 or right 221 half backplane are electrically connected to all ground planes in jumper 222 through ground pins in connectors 302, 402, 502 and 504. Thus, the 0 VDC is electrically isolated from the ground planes everywhere on the backplane assembly except down the middle of the jumper (by "electrically isolated", it is meant that there exists no direct electrical connection having negligible impedance, although there may be current paths through components having significant though finite impedance).

Because jumper 222 is substantially symmetrical, the power plane voltage potential along row of vias 523 and ground plugs 521, 522, should be equal, whether power is being balanced between the two halves of the backplane or being supplied by only a single power supply. Thus, power current (which should be carried on the 0 VDC power plane) in the ground planes is effectively minimized. For purposes of minimizing any voltage gradient across the ground planes, this design is similar to a single point of grounding the 0 VDC power plane.

Figure 7:
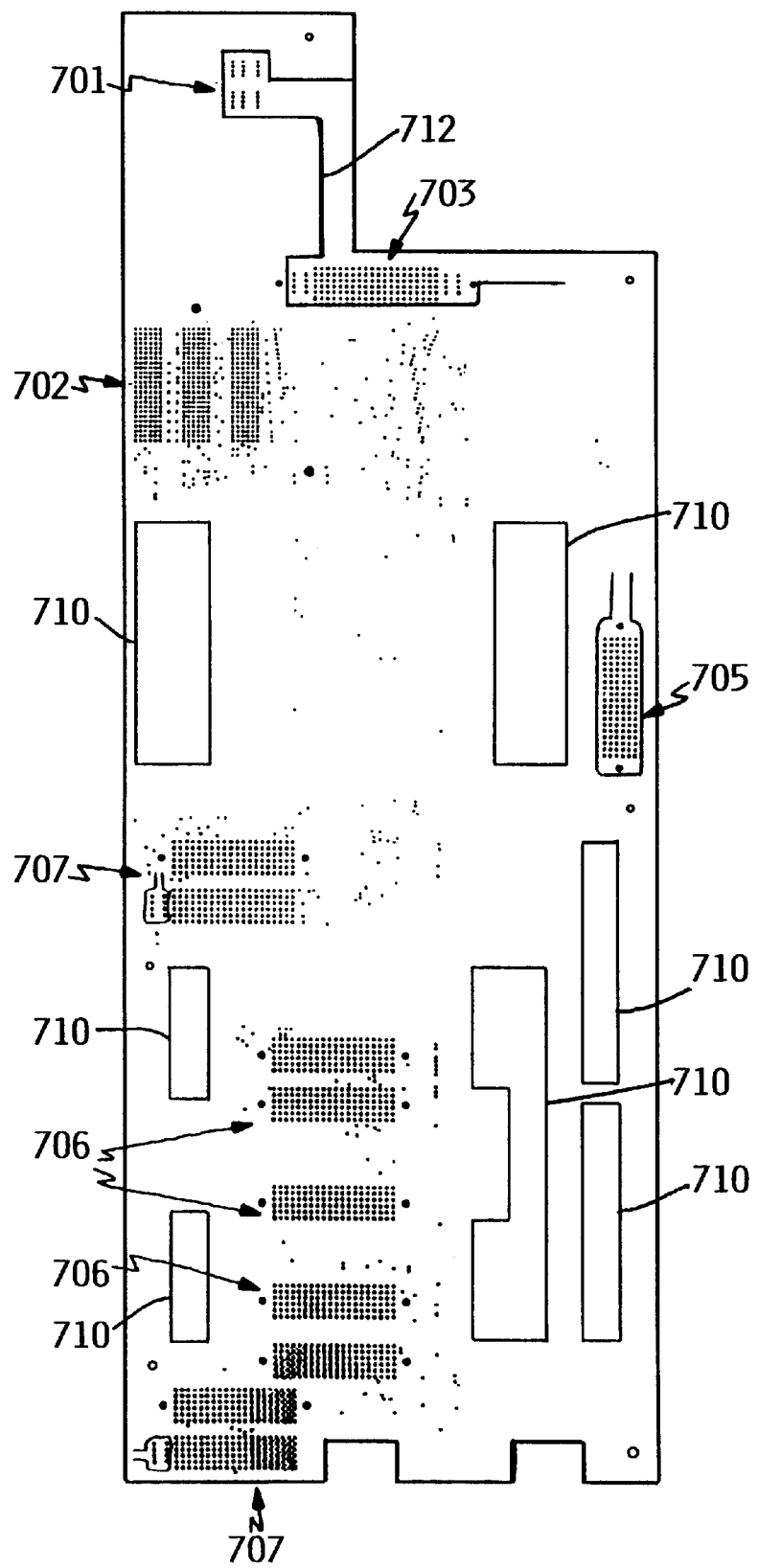
FIG. 7 is a view of a voltage power plane for left section backplane circuit card, showing the location of islands and power ramps, according to the preferred embodiment.

FIG. 7 is a view (from rear) of a power plane for left section circuit card 220. As can be seen by comparing FIG. 7 to FIGS. 3A and 3B, the power plane generally follows the contours of card 220, and contains air flow holes 710 corresponding to holes 310 in card 220. The power plane includes a plurality of smaller holes for connector pins, which appear in FIG. 7 as rectangular groups or arrays of black dots. Some of these holes are slightly larger than corresponding physical pin holes in the card, creating a small insulating void around the pin to electrically isolate the pin from the power plane. At other pin holes, the plane extends all the way to the pin hole edge, creating an electrical contact with the pin when the hole is filled with solder during assembly of the circuit card. Additional isolated scattered holes may be signal via holes, ground via holes, or mounting holes.

Both the +48 VDC power plane and the 0 VDC power plane for a particular circuit card are nearly identical. Both planes are identical with respect to the outer edges, the locations of all via holes for signal vias, ground vias and power vias of other voltages, all mounting and cooling holes, and the edges of all non-conductive voids which define the boundaries of ramps and islands. The only differences between the two planes are the identity of particular connector pin locations which are either electrically connected or insulated. I.e., each via which forms a fill or connection with one power plane is always surrounded by an insulating void at the other power plane. These differences occur only within the corresponding islands. These differences are too small to see in FIG. 7, and so FIG. 7 may be regarded as either the +48 VDC plane or the 0 VDC plane. The same observations are true of FIGS. 8 and 9, further described below.

Hole group 701 corresponds to power connector 301, each hole accommodating a respective pin from the connector. Hole group 702 corresponds to signal connector 302 to jumper. Similarly, hole groups 703, 705, 706 and 707 correspond to connectors 303, 305, 306 and 307, respectively.

To the left of each of hole groups 707 will be seen a horseshoe shaped line surrounding two columns of holes. A similar but much larger structure surrounds hole group 705. These lines represent voids in the power plane. These voids effectively create small conductive areas in the vicinity of the holes, which are isolated from the rest of the power plane at most of their perimeter, and electrically coupled to the power plane only at a relatively long and narrow connecting area. These conductive areas are referred to herein as "islands", and the land and narrow connecting areas as "ramps". The main portion of the power plane, which surrounds the islands, is referred to as the "body". The body of the plane distributes current among the islands. Specifically, it distributes power from the power supply island to the islands associated with the various power consuming modules, including the card cage (the direction of current flow depending on the polarity of the voltage in the power plane).

Void 712 nearly surrounds hole groups 701 and 703, and defines a ramp to the right of group 703. The comparatively large island defined by this void encompasses all the power supply connections. I.e., hole group 703 corresponds to the connector to power supply 201, which normally supplies power to backplane section 220. In the event of failure or absence of supply 201, power to backplane section 220 is provided by power supply 202, through the connections in jumper card 222. This power is routed through power connector 301, corresponding to hole group 701. Thus the power to card 220 is always routed through the island defined by void 712, regardless of which power supply is actually providing it. Conversely, if power supply 202 should fail, requiring power supply 201 to double its output in order to supply the power needs of card 221 and its attached modules, the additional current is routed through the island defined by void 712, without traversing the body of the power planes in card 220.

The island and ramp configuration is used around connector pins which are electrically connected to one or the other of the power planes. These are the connections which either supply electrical power to an attached module or receive electrical power from an attached power supply. Because power is being supplied to modules through these pins, they normally conduct a relatively high electrical current in comparison to pins used for transmitting data signals. It will further be observed that, in order to carry the necessary current, typically an array of power pins is contained in each island, generally half the pins being for each of the two electrical voltages (+48 VDC and 0 VDC) used for power distribution. Multiple pins are used to supply power from the same power plane, through the same connector, to the same module. This is done in order to reduce the electrical current through each individual pin.

Figure 8:
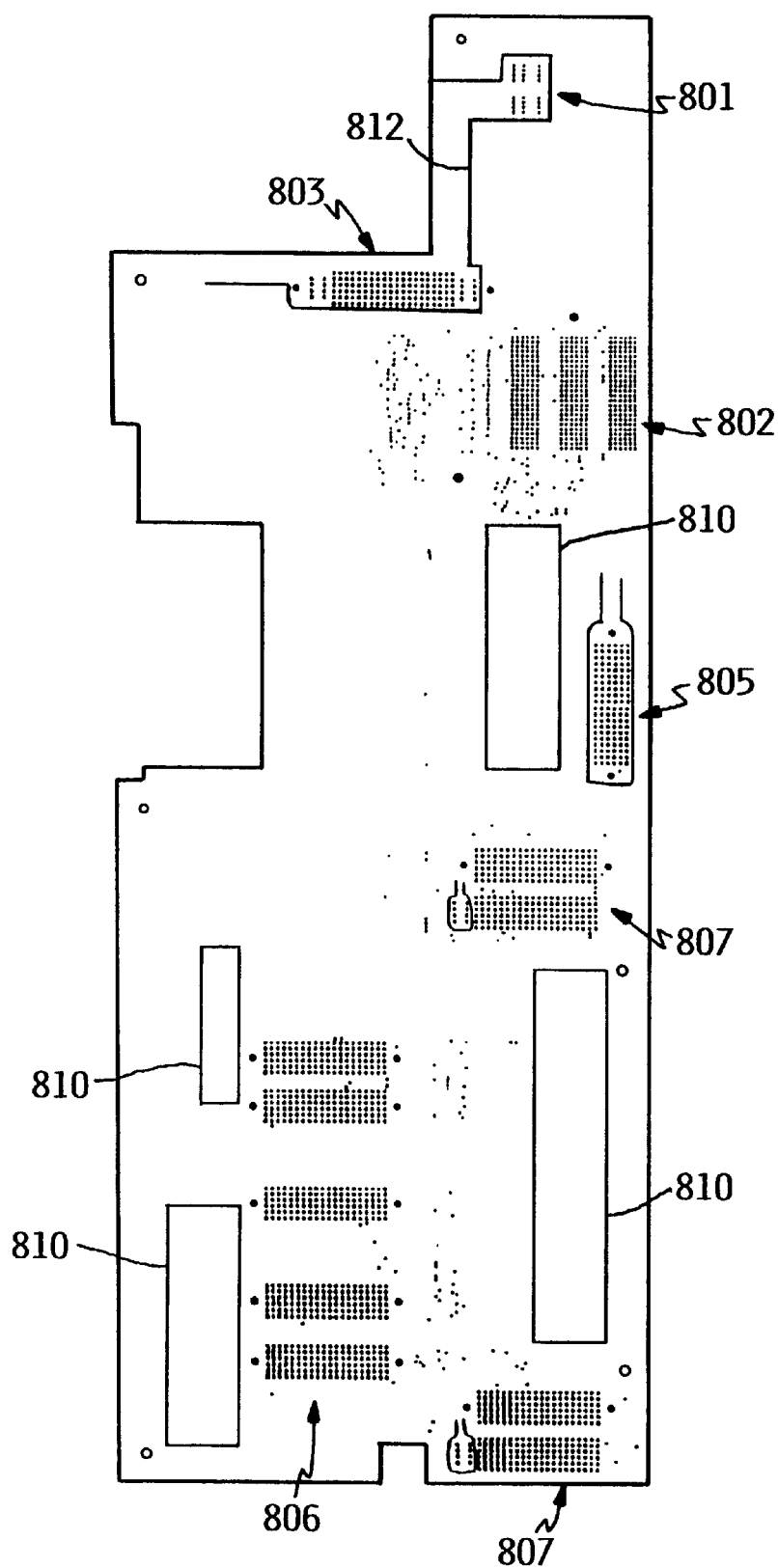
FIG. 8 is a view of a voltage power plane for right section backplane circuit card, showing the location of islands and power ramps, according to the preferred embodiment.

FIG. 8 is a view of a power plane for right section circuit card 221. As can be seen by comparing FIG. 8 to FIGS. 4A and 4B, the power plane generally follows the contours of card 221, and contains air flow holes 810 corresponding to holes 410 in card 221. The general construction and layout is similar to that of left card 220. As in the case of the power plane for left circuit card 220, the power plane for right card 221 includes a plurality of smaller holes for connector pins, which appear in FIG. 8 as groups or arrays of black dots, some of which depict insulating voids while others depict connections to the via.

Hole group 801 corresponds to power connector 401, each hole accommodating a respective pin from the connector. Hole group 802 corresponds to signal connector 402 to jumper. Similarly, hole groups 803, 805, 806 and 807 correspond to connectors 403, 405, 406 and 407, respectively.

Horseshoe shaped voids defining islands and ramps will be seen near hole groups 807, and surrounding hole group 805. Similarly to left card 220, void 812 defines a single large island and ramp encompassing hole groups 801 and 803, which correspond to the power connectors.

Figure 9:
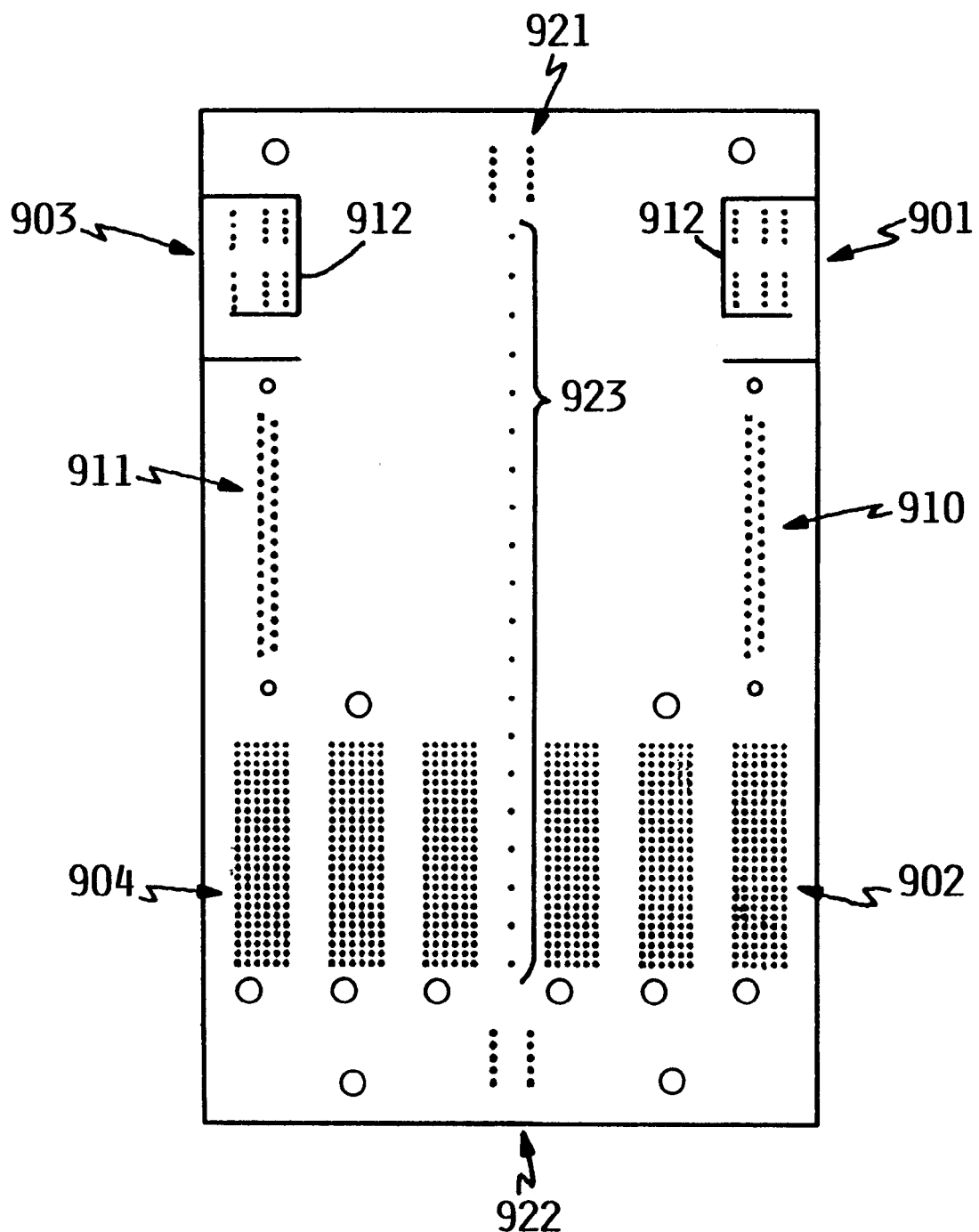
FIG. 9 is a view of a voltage power plane for jumper section circuit card, according to the preferred embodiment.

FIG. 9 shows a power plane for jumper section 222. As can be seen be comparing FIG. 9 to FIGS. 5A and 5B, the power plane is the same shape as jumper card 222, and contains connector pin holes corresponding to the various features of the jumper, which appear as black dots on the power plane of FIG. 9. Hole group 901 corresponds to power connector 501, each hole accommodating a respective pin from the connector. Hole group 803 corresponds to power connector 503 for the opposite side. Similarly, hole groups 902, 904, 910, 911, 921 and 922 correspond to connectors 502, 504, 510, 511, 521 and 522, respectively. Surrounding power hole groups 901 and 903 are respective voids 912 defining islands and ramps.

A row of holes 923 runs down the middle of the power plane, corresponding to grounding vias 523. On the 48 VDC power plane, all these holes are insulated from the via. On the 0 VDC power plane, all these holes represent connections to the grounding via, which electrically connects the 0 VDC power plane with the various ground planes. Similarly, hole groups 921 and 922 also represent grounds, being connected to the chassis ground and to each ground plane. In the 48 VDC power plane, hole groups 921 and 922 are insulated from the pins within, while in the 0 VDC power plane, these hole groups represent electrical connections to the pins.

The island and ramp configuration helps to reduce the effect of transients, particularly those caused by unplugging or plugging a module. For example, without the island and ramp, if a module which is powered on (i.e., receiving power) is suddenly unplugged from the backplane, so that power is abruptly disconnected, there is a sudden large change in the electrical current density function for the power plane, which is particularly acute in the vicinity of the pins which supply power to a module. Similarly, plugging a powered-off module into the backplane causes a large current spike (and possible arcing) as a result of sudden application of voltage to what is effectively a large discharged capacitor. The resulting induced voltages from the magnetic field can corrupt data signals in one or more of the signal planes.

The island and ramp configuration reduces these effects in several ways. The two power planes are preferably of identical patterns (except at connections to the power pins), separated by a single thin dielectric layer. Channelling all the current through power ramps which are mirrored in the two power planes causes a high degree of coupling of pairs of power ramps in different respective planes, significantly reducing electromagnetic field effects of the current surges.

Figure 10:
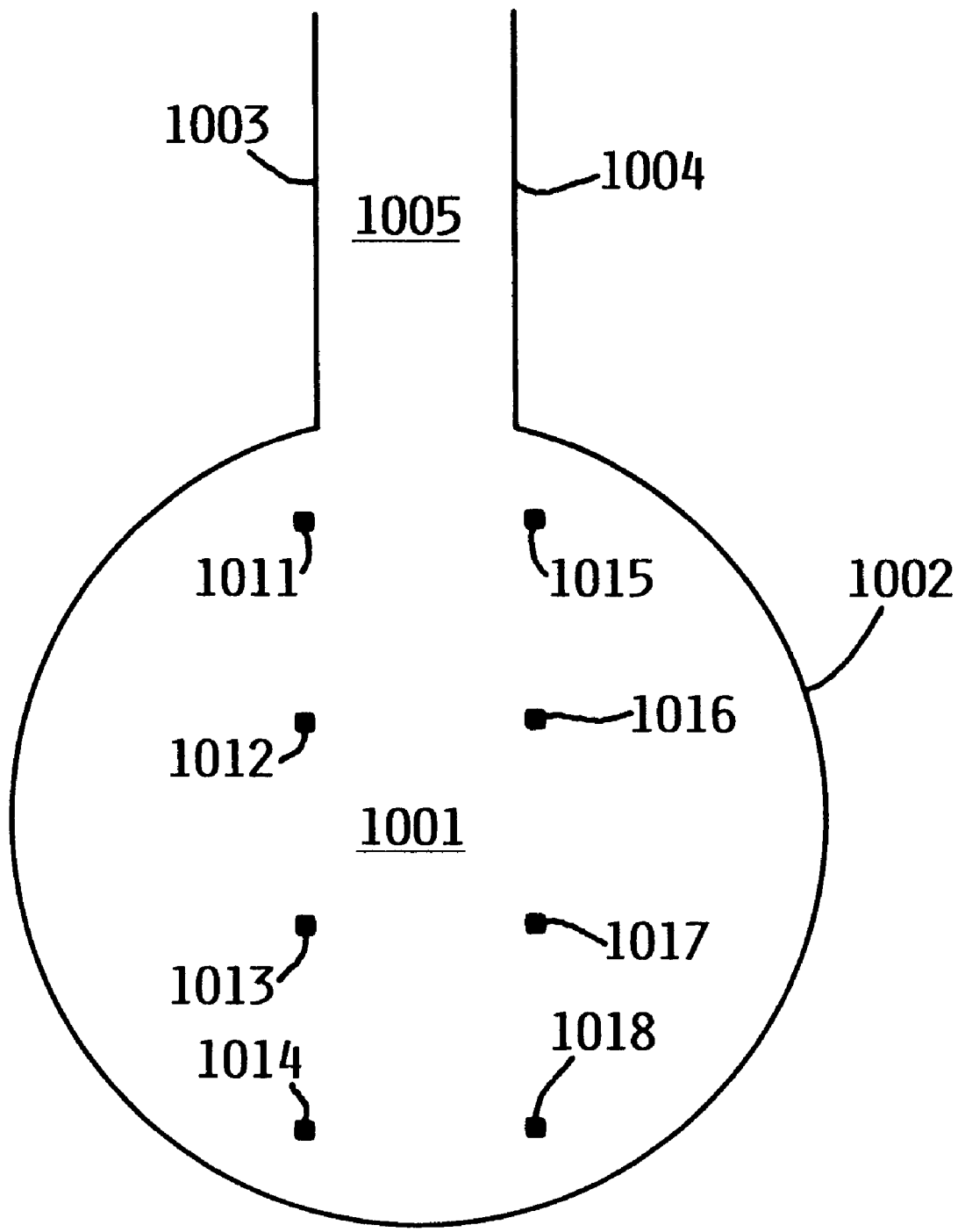
FIG. 10 is enlarged partial view of a voltage power plane, showing a typical island and power ramp in greater detail, according to the preferred embodiment.

FIG. 10 illustrates a typical island, ramp and pin connections. Island 1001 is the area defined by a circular void pattern 1002, having an opening and parallel voids 1003, 1004 extending from the opening. The area between parallel voids 1003, 1004 is the ramp 1005. In this example, eight power pin holes 1011–1018 are within island 1001, each hole corresponding to a connector pin used for transmitting electrical power. Pins through four of the holes 1011–1014 provide power at the voltage of the plane containing island 1001, and are therefore electrically coupled to island 1001. The remaining four pins through holes 1015–1018 are electrically insulated from island 1001, and electrically coupled to a mirror image of island 1001 in the other power plane. Although not shown in the example of FIG. 10, insulated holes for signal pins are within some islands where a single connector is used for both power and data signals.

Preferably, certain parameters are observed in the design of islands and ramps. The length of ramp 1005 (i.e., the length of either void 1003 or 1004) is preferably the greater of either: (a) the distance between ramp 1005 and the nearest power pin hole 1011; or (b) twice the width of ramp 1005. The width of ramp 1005 is determined by the acceptable temperature rise in the power layers due to the current density, i.e., ramp 1005 is made quite narrow given the constraints of current and temperature rise. The shape of the island is not particularly significant; although a circular island is shown in FIG. 10, the island could be oblong, rectangular, or other shapes. The ramp is preferably of constant width, and surrounds no vias, mounting or cooling holes.

Substantially identical power plane patterns with maximum power plane to power plane coupling and minimum signal plane to power plane coupling will minimize resultant magnetic fields which will minimize the effect of induced voltage in signals during power surges. In order to maximize electro-magnetic coupling between the two power layers 609, 610, it is preferable that the physical distance (i.e., thickness of dielectric layer 629) between the two power planes be as small as possible, without risking dielectric breakdown. Furthermore, in order to minimize electromagnetic coupling between the signal planes and the power planes, it is preferred that respective ground planes 608, 611 be placed on either side of the pair of power planes, and that the insulating layers 628 and 630 be relatively thick. However, in the design of any circuit card, these parameters must be regarded as goals rather than absolutes, and it is recognized that other design constraints may impose countervailing requirements.

For example, in the backplane circuit card of the preferred embodiment, dielectric layer 629 separating the two power planes is approximately 0.124 mm thick. This is actually only slightly thinner than some other dielectric layers in the circuit card, but in view of the fairly high voltage difference between the power planes, such a dimension is deemed desirable. Where a card is used to distribute power at lower voltages or other parameters are different (such as a stronger dielectric material), it may be possible to design a thinner insulating layer between the power planes. Dielectric layers 628 and 630, separating the power planes from ground planes 608 and 611, are each approximately 0.130 mm thick, while dielectric layers 627 and 631, separating ground planes 608 and 609, respectively, from adjacent signal planes, are each approximately 0.188 mm thick. These dimensions do not necessarily represent an ideal from the standpoint of electromagnetic transient isolation, but were chosen in order to achieve other goals as well, such as manufacturability and cost.

Each pair of matching islands in the two power planes surrounds all the +48 VDC and 0 VDC connections to a particular module. Accordingly the amount of current carried by each island is exactly the same as the current carried by the matching island in the other voltage plane. Because the conductive path through the ramp is relatively long and narrow, asymmetrical current distribution within the island is largely dispersed by the time current reaches the opening at the end of the ramp to the body of the power plane, and current densities are these locations of the two power planes are equal in magnitude and opposite in direction. Because the bodies of the two power planes are dimensionally nearly identical, and current densities at the openings to the power ramps are equal in magnitude yet opposite in direction, current densities remain equal in magnitude and opposite in direction everywhere within the body of the power planes.

Electro-magnetic effects are reduced by the tight coupling of the two power layers, but the reduction is most effective when the magnitude of current in each power plane is the same. Therefore, all return current to the power supplies should be carried in the 0 VDC power plane 610. Any current leakage into the ground planes 602, 605, 608, 611, 614 and 617 reduces the effectiveness of coupling the two power layers.

In order to further improve resistance to transients, it is preferred that islands and ramps be kept relatively small, and that signal lines avoid passing directly over or under the islands and ramps, to the extent possible. It is within the islands that the current densities will be asymmetrical, producing the largest resultant electromagnetic forces during rapid current changes, e.g., as caused by hot plugging. To this end, areas in signal planes directly over or under islands may be designated "keep outs" during design of the signal planes. I.e., signal wires are not routed unnecessarily through such areas.

Figure 11:
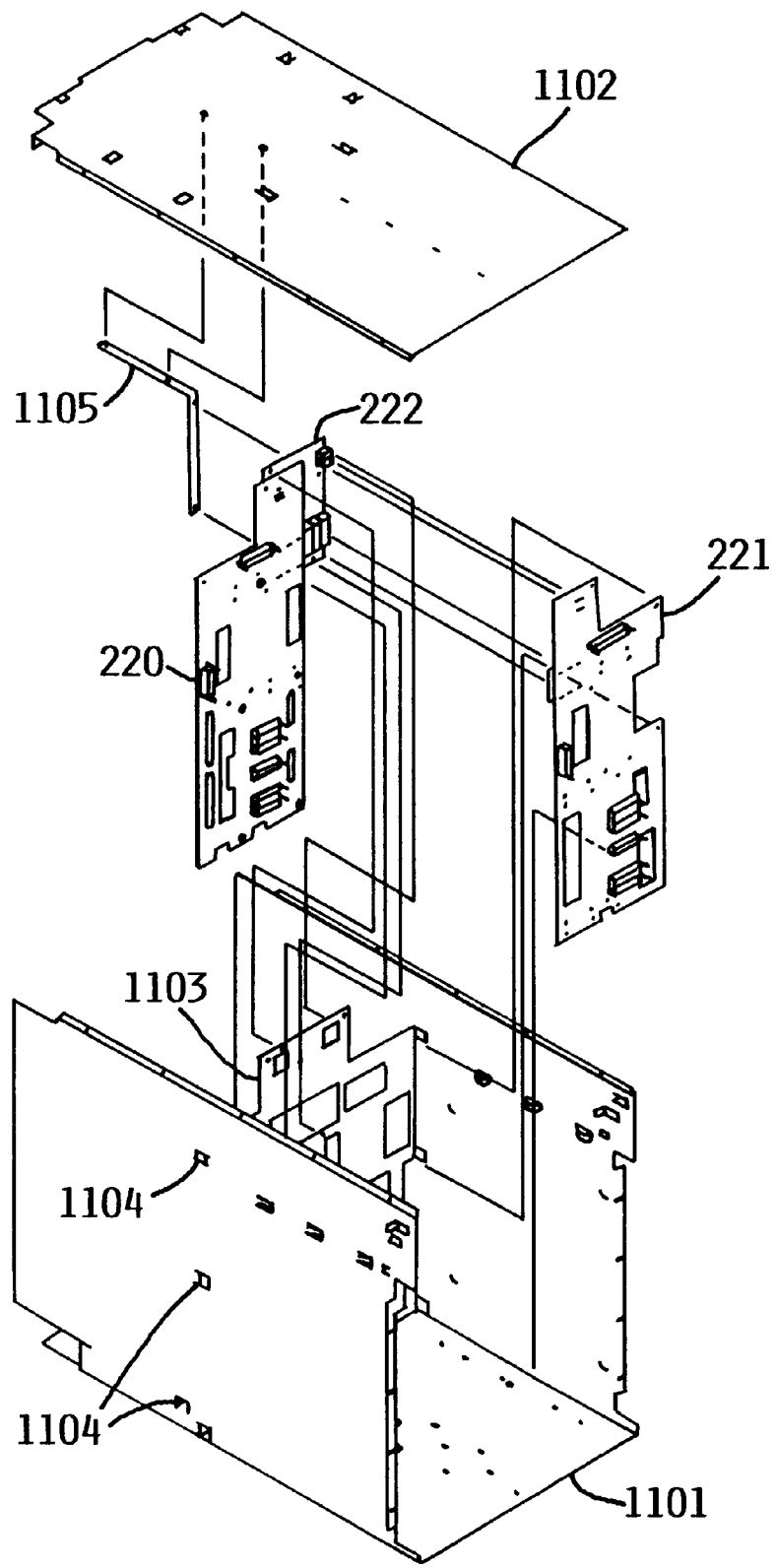
FIG. 11 is an exploded perspective view of the mounting frame for the electronics drawer, showing the mounting locations of the backplane circuit card assembly, according to the preferred embodiment.

FIG. 11 is an exploded perspective view of the mounting frame and associated hardware for electronics drawer 102, according to the preferred embodiment. The mounting frame includes U-shaped bottom-and-side section 1101 and top section 1102, both of which are formed sheet steel containing appropriate mounting holes, tabs and other features. The backplane assembly, comprising cards 220, 221 and 222, is positioned approximately in the center of section 1101, perpendicular to the sides and bottom. A sheet steel stiffener 1103 is attached to section 1101, and positioned parallel to cards 220, 221 and 222. Stiffener 1103 contains holes for cooling airflow corresponding to the various holes in cards 220 and 221. Stiffener 1103 also contains holes for various connectors mounted on cards 220, 221 and 222. Cards 220 and 221 are mounted on the front side of stiffener 1103, while card 222 is mounted on the rear side. Thus, stiffener 1103 lies in a plane between the jumper and the two functional halves. A thin plastic insulator (not shown) prevents electrical contact between cards and stiffener.

Cards 220 and 221 are mounted to stiffener 1103 and section 1101 with screws, at the locations indicated. Screws along the sides of section 1101 are installed through holes in cards 220, 221 and stiffener 1103, threading into tabs 1104 on section 1101. Either card 220 or 221 can be removed independently of the other, by first sliding all modules in its respective half of the drawer out the front or rear, unscrewing the mounting screws from the stiffener and section 1101, and then pulling the card forward, thereby disconnecting it from the jumper.

Grounding bus bar 1105 forms a frame ground for the backplane assembly. Ground bar 1105 is a solid metal bar attached to jumper 222 via screws at plugs 521 and 522, the two screw locations providing redundant attachment to the jumper. Bar 1105 is also attached to top section 1102 via two redundant screws. This arrangement of ground bar 1105 also provides additional structural support to the backplane circuit card assembly.

In the preferred embodiment described above, jumper card 222 is non-redundant and constitutes a possible single point of failure for the system. Because jumper 222 contains no attached components other than connectors (contains no active devices, resistors, capacitors, etc.), the probability of jumper failure is considered extremely low, and accordingly this portion of the system is non-redundant. However, it would have alternatively been possible to design the system in such a way that the jumper itself could be concurrently maintained and replaced. There are several ways in which this could have been done. It would have been possible to construct the backplane with a second jumper card, located between the left and right circuit cards below jumper 222. In this case, it would not have been necessary to place both power monitor connectors 510 and 511 on jumper 222; one such connector would be on jumper 222, while the other would be on the second jumper (the system being capable of operation with only one such power monitor connection). Another alternative would have been to relocate power monitor connectors 510 and 511 to the left and right circuit cards respectively, and construct a second jumper card having extremely limited function. I.e., the second jumper would only connect the 0 VDC, ground planes, and chassis ground, without any transmission of data. Because each half of the backplane is independently capable of supporting a system, data running between the two halves is not necessary for minimal operation. However, in any implementation which would disrupt communications between the two halves during concurrent maintenance, it would be necessary for control software to temporarily shut down one half of the system or otherwise guarantee re-synchronization of the two parts of the system after data communication is restored.

In the preferred embodiment, the power planes are located in the middle of the various layers which make up the circuit card, with signal planes located on either side of the power planes. This arrangement buries the power planes far from components on either side of the backplane. However, it would alternatively be possible to locate the power planes near a surface of the card, with all signal planes being located to one side of the power planes. This arrangement may prove advantageous if, e.g., connectors and other components are located on only one side of the backplane.

In the preferred embodiment, a three-part backplane is used in order to enable portions of the backplane itself to be replaced during system operation. However, it would alternatively be possible to construct a system using the voltage islands disclosed herein with only a single-piece non-redundant backplane.

In the preferred embodiment, the backplane is used only for distribution of power and signals among pluggable components, and itself contains no active functional electronic components. However, it would alternatively be possible to construct backplanes having islands and ramps as described herein, which also carry functional components such as processors, switches, programmable logic arrays, etc. If such a backplane is to be redundant, it may be necessary to duplicate functional components on different sections of the backplane.

In the preferred embodiment, a backplane circuit card for power distribution is designed to pluggably receive both the modules which supply power and the modules which consume power. However, it would alternatively be possible to construct systems in which any single backplane receives only modules of a single type. For example, a backplane may have several pluggable couplings for receiving disk drive modules (consumers of power), and be connected by flexible cable or any of various other conventional connection means to one or more power supplies, or to a second backplane into which one or more power supplies are plugged. Similarly, multiple power supplies may plug into a backplane to form a power bus, which is connected to the power consumers by cable or other means.

In the preferred embodiment, a pair of power planes is used to distribute power at a voltage somewhat higher than normally used by semiconductor circuits. The higher distribution voltage (48 volts) reduces current in the distribution medium. It is expected that each module will have circuitry necessary to produce working voltages such as 5 volts. However, it would alternatively be possible to construct a system in which all working voltages are distributed on the power planes, or in which a combination of higher distribution voltages and working voltages are distributed on the power planes. In this case, more than two power planes may be necessary. For example, a backplane circuit card may have three power planes, for 0, +5 and +12 volts, each power plane having corresponding islands as described herein. As an alternative example, the backplane may contain power planes at +48 VDC distribution voltage, 0 VDC return distribution voltage, +5 VDC working voltage, and 0 VDC return working voltage. Even if working voltages are distributed to modules by the backplane, there should be isolation between the 0 VDC power plane and the ground planes.

In the preferred embodiment, the island is isolated from the body of the power plane by voids, and electrically connected to that body by a straight ramp of substantially uniform width. The ramp of uniform width is preferred in order to increase coupling between the two power layers. However, it would alternatively be possible to design islands with other types of connections, and in particular this may be desirable where there is insufficient area on the power planes for the ramps of the preferred embodiment, or other design considerations dictate a different geometry. For example, curved or spiral ramps might be used to conserve space. Ramps would not necessarily have to be uniform width. Finally, ramps may be defined by something other than a pair of elongated voids in the power plane. For example, where the island is connected to the body at an edge or hole of the circuit card, a ramp may be bounded by the edge or hole of the circuit card on one side, and a void on the other.

In the preferred embodiment, the primary motivation for a backplane having increased resistance to transients is to support concurrent maintenance of pluggable modules. However, it would alternatively be possible to use such a design for circuit cards in an electronic system having limited or no concurrent maintenance capabilities. The increased resistance to transients in general improves the robustness of the system, reducing the probability of system failure due to anything from lightning to physically dropping a unit. Mobile electronic systems in particular might benefit from such a design, whether or not they are capable of concurrent maintenance.

Although a specific embodiment of the invention has been disclosed along with certain alternatives, it will be recognized by those skilled in the art that additional variations in form and detail may be made within the scope of the following claims:

We claim:

1. A backplane circuit card for an electronic system, said electronic system having at least one module for plugging into said backplane circuit card, said backplane circuit card comprising:

a first coupling for insertion of said a first module;

a first power plane for distributing a first voltage among a plurality of system components, said plurality of system components including said first module, said first power plane having a first voltage body and a first island, said first island being associated with said first coupling and being electrically isolated from said first voltage body except at a small area, said first voltage body being electrically connected to said first coupling through said first island; and a second power plane for distributing a second voltage among said plurality of system components, said second power plane lying parallel to and offset from said first power plane, said second power plane having a second voltage body and a second island, said second island being associated with said first coupling and being electrically isolated from said second voltage body except at a small area, said second voltage body being electrically connected to said first coupling through said second island.

2. The backplane circuit card of claim 1, wherein said first and second power planes are separated by a single dielectric layer of substantially uniform thickness.

3. The backplane circuit card of claim 2, wherein said first island is substantially identical in size and shape to said second island, and is located directly opposite said second island across said dielectric layer.

4. The backplane circuit card of claim 2, further comprising:

a first signal plane layer containing a plurality of signal lines for transmission of electronic signals;

a first ground plane lying between said first power plane and said first signal plane layer;

a second signal plane layer containing a plurality of signal lines for transmission of electronic signals, said second signal plane layer lying on a side of said first and second power planes opposite said first signal plane layer and said first ground plane; and a second ground plane lying between said second signal plane layer and said second power plane.

5. The backplane circuit card of claim 1, further comprising:

a plurality of couplings, each coupling for insertion of a respective module;

wherein said first power plane includes a plurality of islands, each island being associated with a respective coupling for a respective module and being electrically isolated from said first voltage body except at a respective small area, said first voltage body being electrically connected to each respective coupling through each respective island associated with the coupling; and wherein said second power plane includes a plurality of islands, each island being associated with a respective coupling for a respective module and being electrically isolated from said second voltage body except at a respective small area, said second voltage body being electrically connected to each respective coupling through each respective island associated with the coupling.

6. The backplane circuit card of claim 5, wherein:

said first and second power planes are separated by a single dielectric layer of substantially uniform thickness; and each island in said first power plane corresponds to a respective island in said second power plane, each corresponding pair of islands in said first power plane and second power plane being associated with a respective coupling, each respective island in said first power plane being substantially identical in size and shape to its corresponding island in said second power plane, and being located directly opposite its corresponding island across said dielectric layer.

7. The backplane circuit card of claim 1, further comprising:

a first signal plane layer containing a plurality of signal lines for transmission of electronic signals; and a first ground plane lying between said first power plane and said first signal plane layer.

8. The backplane circuit card of claim 1, wherein:

said first voltage body is electrically isolated from said first island except at a ramp of substantially uniform width defined by non-conductive voids; and said second voltage body is electrically isolated from said second island except at a ramp of substantially uniform width defined by non-conductive voids.

9. The backplane circuit card of claim 1, further comprising:

a second coupling;

wherein said first coupling is for receiving power from a first power source;

wherein said second coupling is for receiving power from a second power source;

wherein said first island is associated with said first and second couplings, said first voltage body being electrically connected to said first and second couplings through said first island; and wherein said second island is associated with said first and second couplings, said second voltage body being electrically connected to said first and second couplings through said second island.

10. An electronic system, comprising:

a frame for containing a plurality of electronic modules;

a backplane circuit card mounted within said frame, said backplane circuit card distributing electrical power;

at least one power supply module for supplying power to said backplane circuit card;

at least one power consuming module which receives power from said backplane circuit card;

wherein said backplane circuit card comprises:

(a) a first coupling for insertion of a first of said modules;

(b) a first power plane for distributing a first voltage among a plurality of components of said electronic system, said plurality of components including said first module, said first power plane having a first voltage body and a first island, said first island being associated with said first coupling and being electrically isolated from said first voltage body except at a small area, said first voltage body being electrically connected to said first coupling through said first island; and (c) a second power plane for distributing a second voltage among a plurality of components of said electronic system, said plurality of components including said first module, said second power plane lying parallel to and offset from said first power plane, said second power plane having a second voltage body and a second island, said second island being associated with said first coupling and being electrically isolated from said second voltage body except at a small area, said second voltage body being electrically connected to said first coupling through said second island.

11. The electronic system of claim 10, wherein said first module is capable of being unplugged from said first coupling and replaced with a similar module while electrical power is continually supplied to said backplane circuit card by said power supply module.

12. The electronic system of claim 10, wherein:

said electronic system comprises a plurality of power supply modules for supplying power to said backplane circuit card, each of said plurality of power supply modules being associated with a respective coupling on said backplane circuit card; and each of said plurality of power supply modules is capable of being unplugged from its associated coupling and replaced with a similar module while electrical power is continually supplied to said backplane circuit card by another of said power supply modules.

13. The electronic system of claim 10, wherein:

said electronic system comprises a plurality of redundant power consuming modules, each of said redundant power consuming modules receiving power from said backplane circuit card, each of said plurality of redundant power consuming modules being associated with a respective coupling on said backplane circuit card;

each of said plurality of redundant power consuming modules performs a function, said function capable of being performed redundantly by at least one other redundant power consuming module; and each of said plurality of redundant power consuming modules is capable of being unplugged from its associated coupling and replaced with a similar module while said function is continually performed by at least one other of said redundant power consuming modules.

14. The electronic system of claim 10, wherein said first and second power planes of said backplane circuit card are separated by a single dielectric layer of substantially uniform thickness.

15. The electronic system claim 14, wherein:

said first power plane contains a plurality of islands;

said second power plane contains a plurality of islands; and each island in said first power plane corresponds to a respective island in said second power plane to form a corresponding pair of islands, each corresponding pair of islands being associated with a respective coupling, each respective island in said first power plane being substantially identical in size and shape to its corresponding island in said second power plane, and being located directly opposite its corresponding island across said dielectric layer.

16. The electronic system of claim 14, wherein said backplane circuit card further comprises:

a first signal plane layer containing a plurality of signal lines for transmission of electronic signals;

a first ground plane lying between said first power plane and said first signal plane layer;

a second signal plane layer containing a plurality of signal lines for transmission of electronic signals, said second signal plane layer lying on a side of said first and second power planes opposite said first signal plane layer and said first ground plane; and a second ground plane lying between said second signal plane layer and said second power plane.

17. The electronic system of claim 10, wherein:

said first voltage body is electrically isolated from said first island except at a ramp of substantially uniform width defined by non-conductive voids; and said second voltage body is electrically isolated from said second island except at a ramp of substantially uniform width defined by non-conductive voids.

* * * * *